United States Patent [19]

Ollendick

[11] 4,358,690
[45] Nov. 9, 1982

[54] DIGITAL VOLTAGE COMPARATOR

[75] Inventor: Gary B. Ollendick, Mundelein, Ill.

[73] Assignee: Teletype Corporation, Skokie, Ill.

[21] Appl. No.: 170,322

[22] Filed: Jul. 18, 1980

[51] Int. Cl.³ .................... H03K 5/153; H03K 5/24
[52] U.S. Cl. ................................ 307/359; 307/279;
307/362; 307/530
[58] Field of Search ............... 307/530, 353, 358, 359,
307/279, 362; 328/146, 147, 151

[56] References Cited
U.S. PATENT DOCUMENTS

| | | | |
|---|---|---|---|
| 3,955,101 | 5/1976 | Amelio et al. | 307/359 |
| 4,070,590 | 1/1978 | Ieda et al. | 307/530 |
| 4,097,753 | 6/1978 | Cook et al. | 307/359 |

Primary Examiner—John Zazworsky
Attorney, Agent, or Firm—W. K. Serp; J. C. Albrecht

[57] ABSTRACT

A digital voltage comparator is illustrated including a cross-coupled latch 10 having input nodes 12 and 14. After the input nodes 12 and 14 of the latch 10 have been respectively preloaded to the input A and reference E voltage levels during the active state of clock phase $\phi_1$, the latch is allowed to arrive at a stable state during the active state of clock phase $\phi_2$. Thereafter, when clock phase $\phi_3$ is active, the output of the latch 10 is coupled to the input of a single stage shift register 20. The output of the shift register 20 is fed to inverters 22 and 26 and through a voltage divider for preloading the node 14 of the latch 10 during the next active state of clock phase $\phi_1$.

7 Claims, 2 Drawing Figures

DIGITAL VOLTAGE COMPARATOR

DESCRIPTION

TECHNICAL FIELD

This invention relates to a digital voltage comparator for comparing an input signal with a reference signal. The level of the reference signal is preferably related to the level of the immediately preceding input signal.

BACKGROUND ART

Various types of data transmission signals are in common use which conform to one of many recognized standards. The incoming data or input signal is translated to voltage levels which are capable of being processed by decoding circuitry. A commonly used standard to which data transmission signals conform is specified by the Electronic Industries Association and generally called EIA RS-232-C, hereinafter termed the EIA Standard. Although the following discussion particularly considers an input signal conforming to the EIA Standard, other input signals may be accommodated without departing from the scope and spirit of the invention. The EIA Standard specifies that the signal voltage levels are limited to a range between ±3 volts to ±25 volts. Further, the EIA Standard prescribes that a zero input voltage, corresponding to a power down or an open condition be interpreted as a control off or the negative voltage level. Prior known circuits generally used to detect such signal levels have incorporated linear design techniques which are both process and temperature sensitive requiring critical circuit configurations. Voltage comparators utilizing linear operational amplifiers have usually incorporated predetermined threshold levels. That is, when the input level exceeds the threshold level, positive feedback reinforces the incoming signal and produces an abrupt change in the output signal. A particular disadvantage with such linear comparators is their general inability to implement both digital and linear devices using economical processing techniques. The decoding circuit, while often being implemented with MOS logic elements, is interfaced to the incoming signal with linear devices thus precluding the total use of economical large scale integration. The voltage comparator hereinafter described is digital and thus may be conveniently implemented with MOS field effect transistors and incorporated with the necessary decoding logic in a single integrated circuit device.

DISCLOSURE OF THE INVENTION

In accordance with this invention, a digital voltage comparator is provided for comparing an input signal with a reference voltage. A bistable latch is included having first and second nodes. First means preloads the first node to a voltage level determined by the input signal and second means preloads the second node to a voltage level determined by the reference voltage. Third means are included for subsequently allowing the latch to race to a stable state as determined by the preloaded voltage levels of the nodes, and fourth means are described for storing a signal level related to the stable state of the latch. Fifth means, responsive to the signal level of the fourth means, are included for providing the reference voltage to the second means during preloading of the latch following the storing of the signal level related to the stable state of the latch by the fourth means. Additionally, the comparator includes sixth means for providing an output signal which is related to a stable state of the latch.

More particularly, the voltage comparator includes a system clock having a plurality of clock phases with the first and second means being controlled by a first clock phase of the system clock. Additionally, the third means is controlled by a second clock phase of the system clock and the fourth means is controlled by a third clock phase of the system clock. Additionally, the first and third clock phases are non-overlapping. The first and second means includes first and second transistors connected as clocked pass devices which are both controlled by the first clock phase and serve to couple the input signal and the reference voltage to the nodes of the latch.

THE DRAWINGS

FIG. 1 is a schematic diagram of a digital voltage comparator incorporating certain features of this invention; and FIG. 2 is a timing diagram illustrating selected signal levels of the circuit of FIG. 1 during an exemplary operational mode.

DETAILED DESCRIPTION

Circuit

Figure 1:
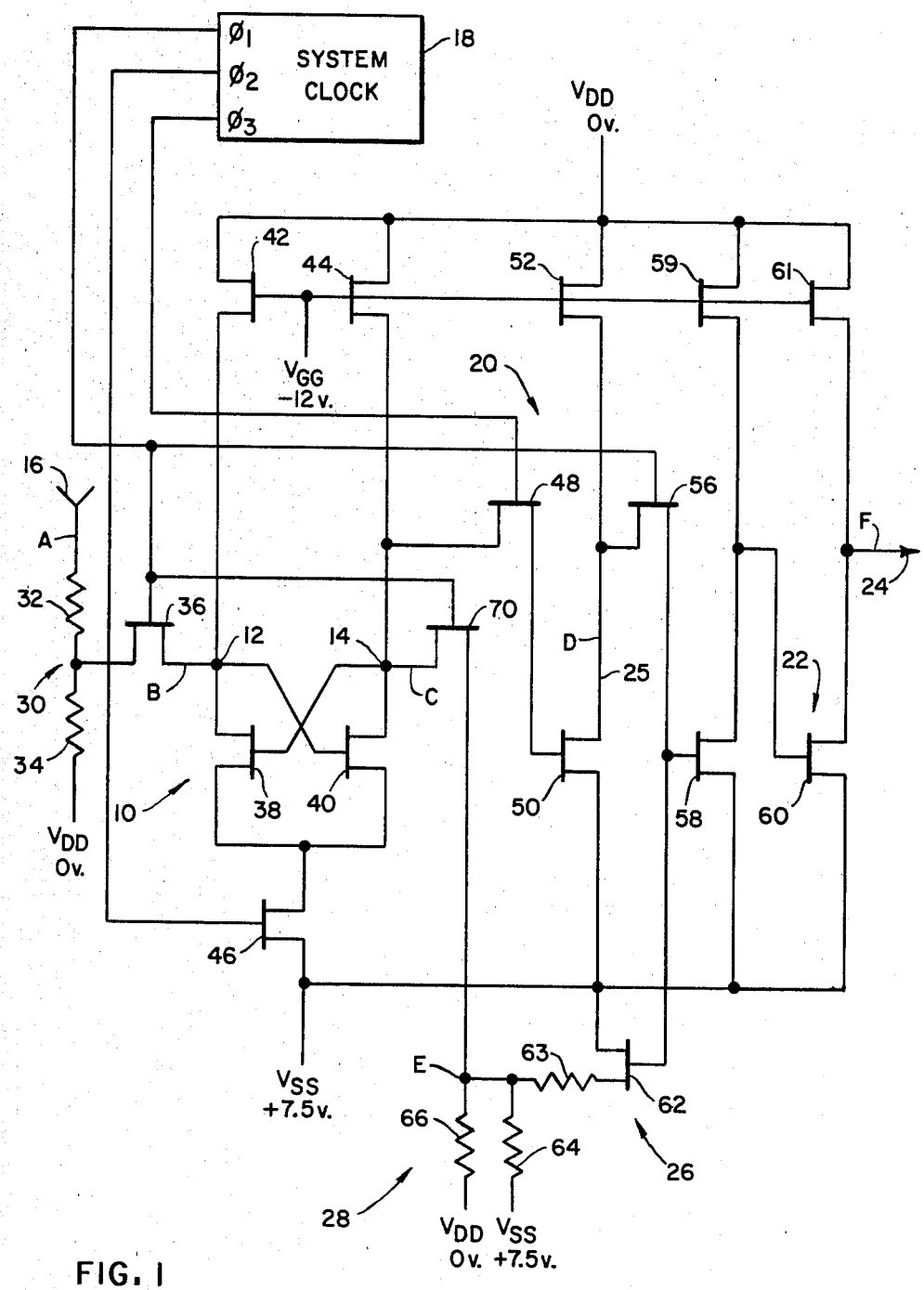

Briefly, the digital voltage comparator circuit illustrated in FIG. 1 includes a cross-couple latch 10 having input nodes 12 and 14. The latch 10 compares the level of an incoming data signal A introduced at input 16 and selectively preloaded to node 12 with a reference signal E selectively preloaded to node 14. As will be subsequently more fully appreciated, the level of the reference signal E is related to the level of the immediately preceding input signal. After the input nodes 12 and 14 of the latch 10 have been respectively preloaded to the input A and reference E voltage levels, the latch 10 is allowed to arrive at a stable state. Thereafter, in response to clocking signals from a system clock 18, the output of the latch 10 is coupled to the input of a single stage shift register 20 which retains the logic state of the latch 10 for a full clock cycle. The output of the shift register 20 is fed to an inverter circuit 22. An output signal F at an output terminal 24 of the inverter circuit 22 drives suitable decoding circuitry (not shown). Thus, the output signal F from terminal 24 follows the input signal A at the terminal 16 after a full clock cycle delay. Additionally, the intermediate node 25 (level D) of the shift register 20 is fed to a second inverter 26. The output of the second inverter 26 is connected to a resistive voltage divider 28 providing the reference voltage level E to node 14 of the latch 10. Since the output E from the voltage divider 28 is derived from the level D of the node 25 of the shift register 20, the reference voltage E preloaded to node 14 (level C) is related to the level of the immediately preceding input signal A at terminal 16 and thus the circuit includes a hysteresis feature as will be subsequently further considered.

The incoming EIA signal A at terminal 16 is fed to a voltage divider 30 including series connected resistors 32 and 34. One end of the voltage divider 30 is connected to the incoming EIA signal A introduced at terminal 16 and the common resistor connection to one diffusion of a transistor 36 connected as a clocked pass device. The remaining diffusion of the transistor 36 is connected to node 12 of the latch 10 and the control electrode of the transistor 36 is connected to phase one $\phi_1$ of the system clock 18 having a frequency preferably higher than the frequency of the incoming signal A. The latch 10 is of conventional construction and comprises a pair of cross-coupled transistors 38 and 40. The drain of transistor 38 is connected to the gate of transistor 40 and the drain of transistor 40 is connected to the gate of transistor 38. The drains of each of the transistors 38 and 40 are also connected through respective load resistors 42 and 44 to the $V_{DD}$ potential of a supply source (not shown). The load resistors 42 and 44 are implemented by unsaturated transistors biased to the $V_{GG}$ potential of the supply source. It will be appreciated that the load resistors may be implemented by other configurations well known in the art. The source diffusions of the latch transistors 38 and 40 are commonly connected to the drain of a transistor 46 serving as a clock pass device. The source of the transistor 46 is connected to the $V_{SS}$ potential of the supply source and the gate electrode of transistor 46 is connected to a second phase $\phi_2$ of the system clock 18.

A signal at the output node 14 of the latch 10 is coupled to a first diffused electrode of a transistor 48 which functions as a clocked pass device. The gate electrode of the transistor 48 is fed by a third phase $\phi_3$ of the system clock 18 with the remaining diffused electrode of the transistor 48 connected to the gate of an inverting transistor 50 which functions as the storage element of the shift register 20. The source of the transistor 50 is connected to the $V_{SS}$ potential of the supply source. The drain of the transistor 50 is connected through a load resistor 52 to the $V_{DD}$ potential of the supply source and the output signal is taken from the drain diffusion of the transistor 50 to one diffused electrode of a transistor 56 configured as a clocked pass device. The gate electrode of the transistor 56 is coupled to phase one $\phi_1$ of the system clock 18 and the remaining diffused electrode is coupled to the gate electrode of an inverting transistor 58. The two clocked pass device transistors 48 and 56 together with the inverting transistors 50 and 58 and respective load resistors 52 and 59, comprise the one bit shift register 20 with the output signal of the shift register being responsive to the level of the input signal with a delay of one clock cycle. The output of the shift register 20 is fed to the control electrode of the output transistor 60 with the output signal F taken from the drain of the transistor 60 which is also returned to the $V_{DD}$ potential of the supply source through a load resistor 61.

Additionally, the level D of the shift register 20 is fed to the gate electrode of an inverting transistor 62 via pass transistor 56. The source of the transistor 62 is connected to the $V_{SS}$ potential of the supply source, and the drain of the transistor 62 is coupled to one terminal of a resistor 63 forming part of the resistance network 28 which also includes resistors 64 and 66 respectively connected to the $V_{SS}$ and $V_{DD}$ potential of the supply source. The signal level at the common connection of the three resistors, 63, 64 and 66 is fed to a diffused electrode to a transistor 70 which is connected as a clocked pass device. The gate of the transistor 70 is commonly connected along with the gate of transistor 36 to phase one $\phi_1$ of the system clock 18. The remaining diffused electrode of the transistor 70 is connected to the node 14 of the latch 10.

OPERATION

In the following discussion particular reference is made to FIG. 2 which illustrates various signal levels of the circuit of FIG. 1 in response to a typical EIA incoming signal A. For purposes of discussion, various supply voltages are indicated; however, it will be appreciated that the voltage levels indicated are provided to facilitate illustration and may be varied without departing from the scope and spirit of the invention. The three clock phases i.e., phases $\phi_1$, $\phi_2$ and $\phi_3$ are illustrated in relation to each other. The biasing of the transistors 36, 46, 48, 56 and 70, which function as clocked pass devices, is such that each transistor is rendered conductive when the level of the clock phase at the respective transistor control electrode is low which is considered the active state of the particular clock phase. Clock phase $\phi_1$ controls the preloading of the latch 10 nodes 12 and 14 with the incoming A and reference E signals. Additionally, when $\phi_1$ is low, the output of the shift register 20 is fed to the output transistor 60 and appears as the output signal level F. Phase $\phi_2$, which is non-overlapping with respect to phase $\phi_1$, releases the latch 10 by way of transistor 46 and the latch 10 races to a stable state as determined by voltages B and C on the nodes 12 and 14. Phase $\phi_3$, which overlaps phase $\phi_2$ and is non-overlapping with respect to phase $\phi_1$, serves to control the coupling of the output of the latch 10 into the storage transistor 50 of the one bit shift register 20. When phase $\phi_3$ goes low, which condition occurs after the nodes of the latch 10 have been loaded and after phase $\phi_2$ has gone low, level C is coupled through the transistor 48 and is stored on the transistor 50 as level D. Subsequent active states of phase $\phi_1$ pass the level of node 25 to the shift register output through the clocked pass transistor 56. Thus, the shift register 20, stores the output of the latch 10 after it has attained its stable state.

Figure 2:
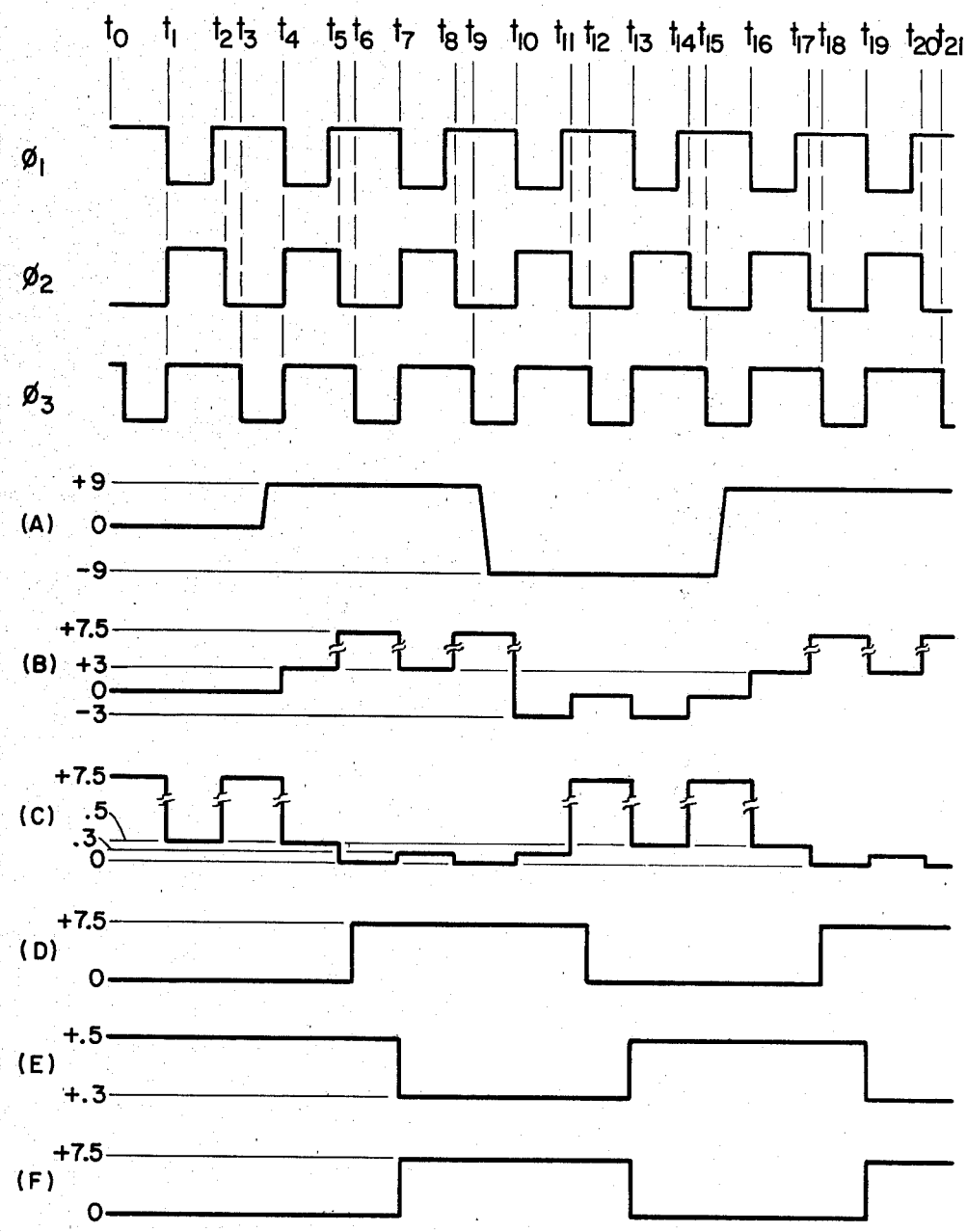

An exemplary EIA input signal A introduced at terminal 16 is shown in FIG. 2 having several exemplary levels during the time period $t_0$ to $t_{21}$. From $t_0$ to $t_3$ an open line or power down condition is illustrated and thereafter the incoming signal A shifts between its two voltage levels i.e. $\pm 9$ volts. At $t_1$, $\phi_1$ goes low and the node 12 preloads with the level of the input signal A to (level B) and the node 14 preloads with the reference signal level E (level C). At this time, node B is preloaded with a level of 0 volts and node C with the feedback level of $+0.5$ volts. At time $t_2$, the latch 10 races to a stable state as determined by the preload voltages at the nodes 12 and 14. Since node 14 was preloaded to a voltage level higher than the voltage level at node 12, node 14 races to the $+7.5$ v $V_{SS}$ supply potential while node 12 remains at the 0v $V_{DD}$ supply potential. Additionally, at time $t_3$, transistor 48 is rendered conductive in response to clock phase $\phi_3$ going low and the voltage level at node 14 is coupled to the shift register storage transistor 50.

At $t_4$, $\phi_1$ again goes low causing the input node 12 of the latch 10 to preload with a proportion of the EIA input signal A through the resistance network 30. Also, the shift register 20 level D is coupled through the pass device transistor 56, to the inverter circuit 22 and to the feedback transistor 62 and the reference level E from the resistor network 28 is coupled to node 14 through the pass device transistor 70. In this way, node 14 of the latch 10 is preloaded with a level $+0.5$ volts. It will be appreciated that node 12 must be preloaded to a level greater than $+0.5$ volts or an input signal A level of greater than 1.5 volts if the latch 10 is to arrive at a stable state with node 12 high. At $t_5$, $\phi_2$ goes low and the latch 10 races to its stable state determined by preload node conditions. At $t_6$, phase $\phi_3$ goes low and the shift register stores the inverted value of node C, bringing level D to +7.5 volts. At $t_9$, the EIA signal shifts and at $t_{10}$, $\phi_1$ again goes low and node 12, level B, preloads to −3 volts and node 14, level C, to +0.3 volts. With $\phi_2$ going low at $t_{11}$, the latch sets with level B going to 0 volts and level C rising to +7.5 volts and when $\phi_3$ goes low at $t_{12}$, the shift register receives level C of the latch.

When the previous input signal to node 12 was high, the feedback voltage level E is +0.3 volts and when the previous input signal to node 12 was low, the feedback voltage level E is +0.5 volts. Thus, if the latch 10 is to change from a low to a high state when B goes low, the input signal A must exceed +1.5 volts and conversely to change from a high to a low state the input signal A must be lower than +0.9 volts. It will be appreciated that this feature assures that an open or 0 volt input will be interpreted as a low in accordance with EIA standards. Further, this feedback arrangement, which is often termed hysteresis, provides a 0.6 volt input signal A guard band thus greatly reducing the possibility of line noise providing an erroneous circuit response.

Although the invention has been particularly shown and described with reference to a preferred embodiment thereof, it will be understood that various changes in form and detail may be made without departing from the scope and spirit of the invention as defined by the following claims.

What is claimed is:

1. A digital voltage comparator for comparing an input signal (A) with a reference voltage (E) comprising:
   a bistable latch (10) having first and second nodes (12, 14),
   first means (36) for preloading said first node (12) to a voltage level determined by the input signal (A),
   second means (70) for preloading said second node (14) to voltage level (C) determined by the reference voltage (E),
   third means (46) for subsequently allowing the latch (10) to race to a stable state as determined by the voltage levels (B, C) of said nodes (12, 14),
   fourth means (20) for storing a signal level (D) related to the stable state of said latch (10),
   fifth means (26) responsive to the signal level (D) of said fourth means (20) for providing said reference voltage (E) to said second means (70) during preloading of said latch (10) subsequent to the storing of the signal level (D) related to the stable state of said latch (10) by said fourth means (20),
   sixth means (22) for providing an output signal (F) which is related to a stable state of said latch (10), said sixth means (22) provides an output signal (F) from the storage means (20) which is related to the input signal (A) to the latch (10) during a preceding time period,
   a system clock (18) having a plurality of clock phases ($\phi_1$, $\phi_2$, $\phi_3$),
   said first and second means (36, 70), being controlled by a first clock phase ($\phi_1$) of said system clock (18),
   said third means (46) being controlled by a second clock phase ($\phi_2$) of said system clock (18), and
   said fourth means (20) being controlled by said first and a third clock phase ($\phi_1$, $\phi_3$) of said system clock (18).

2. The digital voltage comparator of claim 1 wherein:
   said first and third clock phases ($\phi_1$, $\phi_3$), are non-overlapping, and
   said first and second means (36, 70), includes first and second transistors (36, 70) connected as clocked pass devices which are both controlled by said first clock phase ($\phi_1$) and serve to couple said input signal (A) and said reference voltage (E) to the nodes (12, 14) of said latch (10).

3. The digital voltage comparator of claim 2 wherein:
   said fourth means (20) is in the form of a one stage shift register, the input to which is controlled by said third clock phase ($\phi_3$) and the output of which is controlled by said first clock phase ($\phi_1$).

4. The digital voltage comparator of claim 3 wherein:
   the level (D) of said shift register (20) provides the reference voltage (E) to said second clocked pass transistor (70).

5. The digital voltage comparator of claim 4 wherein:
   the active state of said first clock phase ($\phi_1$) is non-overlapping with the active states of said second and third clock phases ($\phi_2$, $\phi_3$), and
   the beginning of the active state of said third clock phase ($\phi_3$) is delayed with respect to the beginning of the active state of said second clock phase ($\phi_2$).

6. A digital voltage comparator for comparing an input signal (A) with a reference voltage (E) comprising:
   a bistable latch (10) having first and second nodes (12, 14),
   first means (36) for preloading said first node (12) to a voltage level determined by the input signal (A),
   second means (70) for preloading said second node (14) to voltage level (C) determined by the reference voltage (E),
   third means (46) for subsequently allowing the latch (10) to race to a stable state as determined by the preloaded voltage levels (B, C) of said nodes (12, 14),
   fourth means (20) for storing a signal level (D) related to the stable state of said latch (10),
   fifth means (26) responsive to the signal level (D) of said fourth means (20) for providing said reference voltage (E) to said second means (70) during preloading of said latch (10) subsequent to the storing of the signal level (D) related to the stable state of said latch (10) by said fourth means (20),
   sixth means (22) for providing an output signal (F) which is related to a stable state of said latch (10),
   a system clock (18) having a plurality of clock phases ($\phi_1$, $\phi_2$ and $\phi_3$),
   said first and second means (36, 70), being controlled by a first clock phase ($\phi_1$) of said system clock (37),
   said third means (46) being controlled by a second clock phase ($\phi_2$) of said system clock (18), and
   said fourth means (20) being controlled by said first ($\phi_1$) and said third ($\phi_3$) clock phases of said system clock (18).

7. The digital voltage comparator of claim 6 wherein:
   said first and third clock phases ($\phi_1$, $\phi_3$) are non-overlapping, and
   said first and second means (36, 70) include first and second transistors (36, 70) connected as clocked pass devices which are both controlled by said first clock phase ($\phi_1$) and serve to couple said input signal (A) and said reference voltage (E) to the nodes (12, 14) of said latch (10), and
   said fourth means (20) is in the form of a one bit shift register, the input to said shift register (20) is controlled by said third clock phase ($\phi_3$) and the output of which is controlled by said first clock phase ($\phi_1$).

* * * * *